(12) United States Patent
Huynh

(10) Patent No.: US 9,523,476 B2
(45) Date of Patent: Dec. 20, 2016

(54) BACKLIT DISPLAY SCREEN INCLUDING LIGHT EMITTING DIODE

(75) Inventor: Tan Duc Huynh, Neuilly sur Marne (FR)

(73) Assignee: Valeo Systemes Thermiques, Le Mesnil-Saint-Denis (FR)

( * ) Notice: Subject to any disclaimer, the term of this patent is extended or adjusted under 35 U.S.C. 154(b) by 0 days.

(21) Appl. No.: 13/883,831

(22) PCT Filed: Nov. 10, 2011

(86) PCT No.: PCT/FR2011/000599
§ 371 (c)(1),
(2), (4) Date: May 7, 2013

(87) PCT Pub. No.: WO2012/062981
PCT Pub. Date: May 18, 2012

(65) Prior Publication Data
US 2013/0242591 A1    Sep. 19, 2013

(30) Foreign Application Priority Data
Nov. 10, 2010   (FR) ...................................... 10 04406

(51) Int. Cl.
*H01L 23/367*    (2006.01)
*F21S 8/10*    (2006.01)
(Continued)

(52) U.S. Cl.
CPC .............. *F21S 48/321* (2013.01); *B60K 35/00* (2013.01); *B60K 37/06* (2013.01); *F21V 29/00* (2013.01);
(Continued)

(58) Field of Classification Search
CPC ................. B60K 2350/302; B60K 2350/2039; H05K 2201/10356; H05K 2201/10128; H05K 2201/10106
(Continued)

(56) References Cited

U.S. PATENT DOCUMENTS 6,502,968 B1   1/2003   Simon
6,522,372 B2 *   2/2003   Yang ............................... 349/58
(Continued)

FOREIGN PATENT DOCUMENTS

EP    2 120 294 A1    11/2009

OTHER PUBLICATIONS

International Search Report issued in PCT/FR2011/000599 mailed on May 31, 2012 (6 pages).

*Primary Examiner* — Tracie Y Green
(74) *Attorney, Agent, or Firm* — Osha Liang LLP

(57) ABSTRACT

The invention relates to a display screen comprising: a housing forming an enclosure; a display surface on the front face of the housing; a printed circuit board arranged inside the housing; and at least one light-emitting diode that forms a back-lighting source for the display surface and is arranged on a face of the printed circuit board. The display screen is characterized in that the printed circuit board is a single-face printed circuit board, the display screen comprises a thermoconductive plate arranged against the face of the printed circuit board opposite the one carrying the at least one light-emitting diode, and the display screen also comprises a second double-face printed circuit board that has a smaller surface than the single-face printed circuit board, is connected to said single-face printed circuit board by at least one electrical connection, and carries at least one element for controlling the back-lighting of the display surface.

11 Claims, 2 Drawing Sheets

(51) Int. Cl.
*G09F 13/22* (2006.01)
*H05K 1/14* (2006.01)
*G02F 1/1335* (2006.01)
*F21V 29/00* (2015.01)
*B60K 35/00* (2006.01)
*B60K 37/06* (2006.01)
*H05K 3/00* (2006.01)

(52) U.S. Cl.
CPC ......... *G02F 1/133603* (2013.01); *G09F 13/22* (2013.01); *H05K 1/141* (2013.01); *B60K 2350/2039* (2013.01); *B60K 2350/302* (2013.01); *G02F 2001/133628* (2013.01); *H05K 3/0061* (2013.01); *H05K 2201/10106* (2013.01); *H05K 2201/10128* (2013.01); *H05K 2201/10356* (2013.01)

(58) Field of Classification Search
USPC ........................................ 362/632, 547, 459
See application file for complete search history.

(56) References Cited

U.S. PATENT DOCUMENTS

| | | | |
|---|---|---|---|
| 7,699,483 B2* | 4/2010 | Bruchhage et al. | 362/84 |
| 2006/0072344 A1* | 4/2006 | Kim et al. | 362/632 |
| 2006/0077674 A1* | 4/2006 | Kleber et al. | 362/459 |
| 2007/0076431 A1* | 4/2007 | Atarashi et al. | 362/613 |
| 2007/0189042 A1 | 8/2007 | Pai et al. | |
| 2008/0310160 A1* | 12/2008 | Kim et al. | 362/245 |
| 2009/0309498 A1 | 12/2009 | Park et al. | |
| 2010/0214238 A1* | 8/2010 | Christoph et al. | 345/173 |
| 2010/0302478 A1* | 12/2010 | Nakagawa et al. | 349/62 |

* cited by examiner

BACKLIT DISPLAY SCREEN INCLUDING LIGHT EMITTING DIODE

The invention relates to a backlit display screen, in particular one integrated into a housing and intended to be incorporated into a vehicle dashboard.

It is known to produce screens that are backlit by light sources such as light-emitting diodes (LEDs). These backlit screens comprise a housing enclosing most of the components of the display screen, said housing comprising a black translucent part forming a panel behind which at least one indicator, such as a pictograph or a transparent liquid-crystal screen, is placed.

The panel comprises, on its front side, i.e. the side oriented toward the user, a shiny translucent paint. The housing is closed in order to guarantee that the interior remains dark. Illumination from the exterior produces a reflection that masks the elements inside the housing. Thus, the symbols and screen can only be seen when the backlighting is activated.

In combination with at least one control button, the user may control, via the display screen, navigation through menus, and control functions of the vehicle such as the air conditioning, the audio system or even the navigation system.

Backlighting of the display area, i.e. illumination via its back side, has advantages in terms of ergonomics and integrability.

Specifically, in the absence of backlighting, a display screen using such a black panel matches, and is therefore integrated into, the passenger compartment perfectly.

A printed circuit board is located in the housing, light-emitting diodes, and electronics controlling the illumination of said light-emitting diodes and the display displayed by the liquid-crystal screen, being placed on said printed circuit board.

This printed circuit board generally comprises a printed circuit, placed on each side of a supporting plate made of resin or polymers, and components are placed on both sides of the supporting plate.

Since the housing is closed, the heat produced by the diodes is relatively poorly evacuated. In particular, plates made of resin have a low thermal conductivity, thus the heat produced by the components accumulates near the latter. High-temperature regions are thus created located in the immediate vicinity of heating components, these regions being known as "hot spots". The temperatures reached may interfere with or even damage said components.

In order to overcome at least partially the aforementioned drawbacks, one subject of the invention is a display screen comprising:
- a housing forming a casing;
- a display area on the front side of the housing;
- a printed circuit board placed inside the housing; and
- at least one light-emitting diode forming a backlighting source for the display area, placed on the printed circuit board, characterized in that the printed circuit board is a single-sided printed circuit board, in that the display screen comprises a thermally conductive plate placed against that side of the printed circuit board which is opposite the side bearing the at least one light-emitting diode, and in that it comprises a second double-sided printed circuit board having a smaller area than the single-sided printed circuit board, connected to said single-sided printed circuit board by at least one electrical connection and bearing at least one element for controlling the backlighting of the display area.

The display screen thus obtained better distributes the heat produced by the at least one light source. In addition, reducing the area of the double-sided printed circuit board used makes it possible to reduce the cost of producing the display screen.

The display screen may furthermore have one or more of the following features, taken alone or in combination.

The thermally conductive plate is made of zamak.

The thermally conductive plate is made of aluminum.

The thermally conductive plate makes contact with the exterior of the housing via a convection area.

The double-sided printed circuit board has an area smaller than or equal to about half the area of the single-sided printed circuit board.

The display screen comprises a thermally conductive layer made of copper placed between the single-sided printed circuit board and the thermally conductive plate.

The double-sided printed circuit board is placed on a support housed on the thermally conductive plate.

The convection area of the thermally conductive plate comprises fins forming a heat sink.

The display area comprises a liquid-crystal screen.

Another subject of the invention is a combined display and control device for an automotive vehicle, characterized in that it comprises a display screen as claimed in at least one of the preceding claims and at least one means for controlling the actuation of a function of the automotive vehicle, and in that the actuation state of the function of the automotive vehicle is indicated by the display screen.

Other advantages and features will become apparent on reading the description of the following figures, in which.

In all the figures, the same reference numbers denote the same elements.

The present invention relates to a display screen intended to be backlit. In particular, the invention relates to a display screen for a vehicle dashboard.

Figure 1:
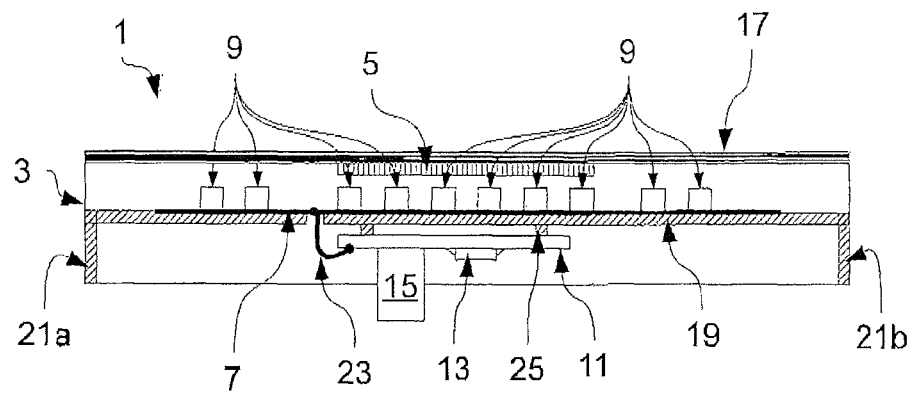
FIG. 1 is a simplified schematic of a cross-sectional view of a display screen according to the invention.

FIG. 1 shows that the display screen 1 comprises a housing 3 forming a casing, in which a display area 5 and a single-sided printed circuit board 7 bearing a plurality of light sources 9 are placed. A second printed circuit board 11 bears a unit 13 for controlling the light sources 9 and the display area 5, and a connector 15 intended to connect the display screen 1 to the electronics of the vehicle.

The light sources 9 are light-emitting diodes, each of which is associated with a power matching circuit comprising at least one current-limiting resistor, dissipating a large amount of heat in operation.

The housing 3 forms an external casing for the display area 5 and comprises a panel 17 turned toward the user, partially letting light pass, the panel 17 comprising a translucent paint on its front side so that the display area 5 can only be seen when the display area 5 is illuminated from its back side by the light sources 9.

The display area 5 for example comprises a high-contrast (for example about 200:1) liquid-crystal screen, or even a mask in which an aperture is formed, the aperture having a shape that will be seen by the user when the light sources 9 are turned on.

The printed circuit board 7 on which the light sources 9 are placed is a single-sided printed circuit board. This first board 7 is placed on a thermally conductive metal plate 19, its side comprising no printed circuit making contact with said plate 19.

The high thermal conductivity of the metal improves the transfer of heat produced by the light sources 9, which heat is then uniformly distributed over the entire volume of the plate 19.

Furthermore, the thermally conductive plate 19 comprises two lateral extensions 21a, 21b. These lateral extensions 21a, 21b of the thermally conductive plate 19 are each directed toward an aperture in the housing 3. The extensions 21a, 21b make contact with the exterior of the housing 3 and thus form a convection area allowing heat to be evacuated from the light sources 9 to the exterior of the housing 3.

The shape of the two extensions 21a, 21b corresponds to that of the associated apertures, and said extensions 21a, 21b close the housing 3 when they are in place.

The thermally conductive plate 19 is for example made of zamak, which is an alloy of zinc, aluminum, magnesium and copper. Zamak has a relatively low cost, is easily molded and has a quite good thermal conductivity. However, it may be envisioned to produce the thermally conductive plate 19 from another metal, such as aluminum, especially by swaging.

The second printed circuit board 11, which holds the control unit 13 and the connector 15, is connected to the first printed circuit 7 by a bundle of electrical connections 23. The second printed circuit board 11 is a double-sided printed circuit board, i.e. one having contact tracks printed on both its sides. The double-sided printed circuit board 11 is smaller than the single-sided printed circuit board 7 and is placed behind the latter on a holder 25 of the thermally conductive plate 19, said holder being formed on the side opposite that on which the single-sided printed circuit board 7 is placed. The bundle of electrical connections 23 especially comprises a plurality of cables connecting contacts of the printed circuits of the two boards 7, 11.

In particular, the second printed circuit board 11 has an area smaller than about half the area of the single-sided first board 7. Since a double-sided printed circuit board has a price per unit area approximately double that of a single-sided printed circuit board, the overall cost of the two boards, single-sided first board 7 and double-sided second board 11, is about the same and even lower than that of a single double-sided board of a comparable size to that of the first 7, as is conventionally used.

Figure 2:
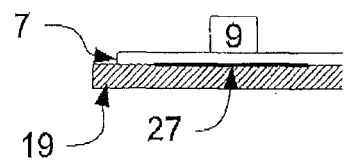
FIG. 2 is a partial cross-sectional view of an alternative embodiment of the single-sided printed circuit board of the display screen.

In an alternative embodiment, shown in FIG. 2, a thermally conductive copper layer 27 forming a thermal bridge is placed between the printed circuit board 7 and the thermally conductive plate 19, at least on area portions under elements that generate a particularly large amount of heat. By screwing the printed circuit board 7 to the thermally conductive plate 19, the thermally conductive layer 27 is pressed against the printed circuit board 7, the supporting layer of which, made of a prepreg, deforms slightly.

Figure 3:
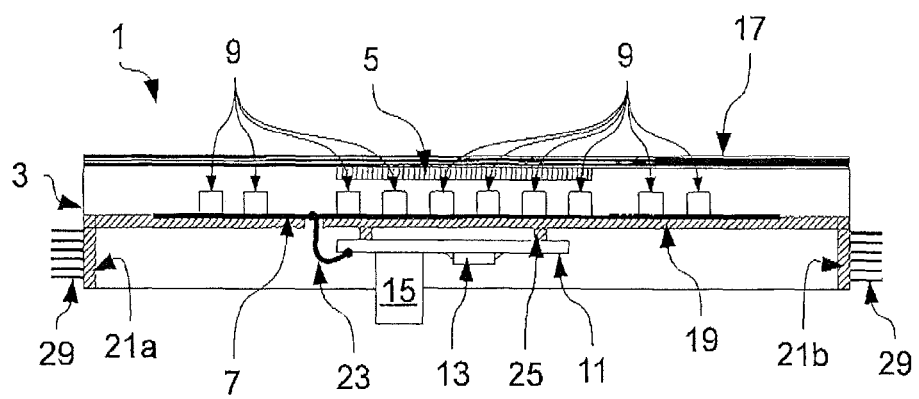
FIG. 3 is a simplified schematic of a cross-sectional view of a variant of the display screen.

FIG. 3 shows a variant of the display screen 1.

The display screen 1 is similar to that in FIG. 1, but it comprises parallel fins 29 on the part of the thermally conductive plate 19 forming the convection area of the extensions 21a, 21b of the thermally conductive plate 19. These parallel fins 29 form heat sinks or radiators and increase the convection area and channel the flow of air.

The invention also relates to a combined display and control device for an automotive vehicle, comprising a display screen 1 such as described above. Such a combined assembly is shown in FIG. 4.

The combined assembly 31 shown illustrates various modes of use of a display screen 1 according to the invention.

Figure 4:
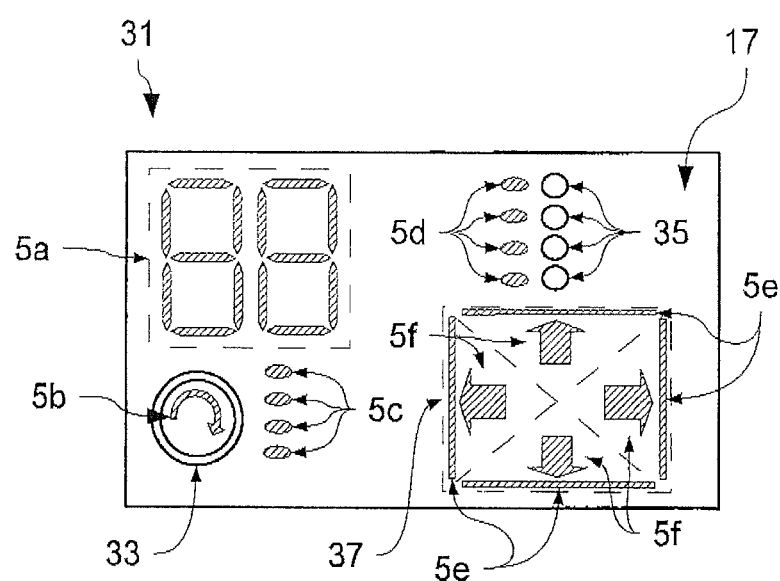
FIG. 4 is a front view of a combined display and control device comprising a display screen according to the invention.

In this FIG. 4, the combined assembly 31 comprises a number of display areas 5a, 5b, 5c, 5d, 5e, 5f located behind a translucent panel 17, and which are associated with control members 33, 35, 37 corresponding to different vehicle functions. The combined assembly 31 comprises a liquid-crystal screen 5a that can display characters, for example in order to indicate a temperature or an audio track number to the user.

The combined assembly 31 may also comprise a rotary button 33 intended to be rotated by the user. This rotary button 33 comprises, on its front side, a display area 5b comprising a backlit pictograph allowing the user to locate said rotary button 33 in the dark.

A plurality of display areas forming indicators 5c may indicate the operational state of a function such as audio volume, or the operating power of the air conditioning. In the example described here, the indicators 5c light up in increasing number when, for example, the audio volume is increased or the power of the air conditioning is increased.

A second plurality of display areas forming indicators 5d may be used to indicate the on/off state of functions associated with a plurality of push buttons 35. In this example, one indicator 5d corresponds to each button 35, said indicator 5d being illuminated when the function associated with the button 35 is turned on.

The combined assembly 31 furthermore comprises a touch sensitive area 37 for example employing a transparent capacitive or resistive film or even piezoelectric sensors that sense deformation of the panel 17. Associated display areas 5e bound the perimeter of said touch sensitive area 37. Additional display areas 5f make it possible to identify the function of the touch sensitive area 37; in the present case these additional areas 5f are directional arrows for navigating through a menu.

The touch screen 1 obtained according to the invention comprises means for evacuating the heat produced by the backlighting device, the light sources 9 of which must be high-power sources due to the presence of the translucent black panel 17.

In addition, by reducing the area of the double-sided printed circuit board 11 used, part of the cost of the heat evacuating device is offset.

The invention claimed is:

1. A display screen comprising:
   a housing forming a casing;
   a display area on the front side of the housing;
   a printed circuit board placed inside the housing;
   at least one light-emitting diode forming a backlighting source for the display area, placed on one side of the printed circuit board,
   wherein the printed circuit board is a single-sided printed circuit board,
   wherein the display screen comprises a thermally conductive plate placed against that side of the printed circuit board which is opposite the side bearing the at least one light-emitting diode,
   wherein the thermally conductive plate comprises a lateral extension that contacts an exterior of the housing, and that is oriented perpendicularly to the printed circuit board, wherein a convection area of the lateral extension of the thermally conductive plate comprises lateral fins forming a heat sink,
wherein the lateral fins are external to the housing, and
wherein the lateral fins are disposed along a height of the lateral extension of the thermally conductive plate such that a length of the lateral fins extends in a direction that is parallel to a length of the thermally conductive plate, as viewed from a cross-section of the display screen; and
a second double-sided printed circuit board having a smaller area than the single-sided printed circuit board, connected to said single-sided printed circuit board by at least one electrical connection and bearing at least one element for controlling the backlighting of the display area.

2. The display screen as claimed in claim 1, wherein the thermally conductive plate is made of zamak.

3. The display screen as claimed in claim 1, wherein the thermally conductive plate is made of aluminum.

4. The display screen as claimed in claim 1, wherein the thermally conductive plate makes contact with the exterior of the housing via a convection area.

5. The display screen as claimed in claim 1 the double-sided printed circuit board has an area smaller than or equal to about half the area of the single-sided printed circuit board.

6. The display screen as claimed in claim 1, wherein the double-sided printed circuit board is placed on a holder housed on the thermally conductive plate.

7. The display screen as claimed in claim 1, further comprising a thermally conductive layer made of copper placed between the single-sided printed circuit board and the thermally conductive plate.

8. The display screen as claimed in claim 1, wherein the display area comprises a liquid-crystal screen.

9. The display screen as claimed in claim 1, wherein the housing comprises a panel partially letting light pass, so that the display area can only be seen when it is illuminated from its back side by the at least one light-emitting diode.

10. The display screen as claimed in claim 9, wherein the panel comprises a translucent paint on its front side.

11. A combined display and control device for an automotive vehicle, comprising:
a display screen as claimed in claim 1; and
at least one means for controlling the actuation of a function of the automotive vehicle, and in that the actuation state of the function of the automotive vehicle is indicated by the display screen.

* * * * *